United States Patent
Curran et al.

(10) Patent No.: US 11,032,930 B2
(45) Date of Patent: Jun. 8, 2021

(54) TITANIUM SURFACES WITH IMPROVED COLOR CONSISTENCY AND RESISTANCE TO COLOR CHANGE

(71) Applicant: Apple Inc., Cupertino, CA (US)

(72) Inventors: James A. Curran, Sunnyvale, CA (US); Todd S. Mintz, San Jose, CA (US); Daniel T. McDonald, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/563,719

(22) Filed: Sep. 6, 2019

(65) Prior Publication Data

US 2020/0383223 A1     Dec. 3, 2020

Related U.S. Application Data

(60) Provisional application No. 62/853,596, filed on May 28, 2019.

(51) Int. Cl.
| | | |
|---|---|---|
| *C25D 11/24* | (2006.01) | |
| *C25D 11/26* | (2006.01) | |
| *H05K 5/00* | (2006.01) | |
| *H05K 5/04* | (2006.01) | |
| *H05K 5/06* | (2006.01) | |

(52) U.S. Cl.
CPC .............. *H05K 5/04* (2013.01); *C25D 11/246* (2013.01); *C25D 11/26* (2013.01); *H05K 5/0086* (2013.01); *H05K 5/069* (2013.01)

(58) Field of Classification Search
CPC ....... C25D 11/246; C25D 11/26; C25D 11/34; H05K 5/04; H05K 5/06
USPC ..................................................... 148/95, 518
See application file for complete search history.

(56) References Cited

U.S. PATENT DOCUMENTS

| | | | | |
|---|---|---|---|---|
| 5,221,459 A | * | 6/1993 | Okano ................... | C25D 11/26 205/322 |
| 2003/0168133 A1 | * | 9/2003 | Kaneko ................. | C25D 11/26 148/518 |
| 2005/0115840 A1 | * | 6/2005 | Dolan .................... | C25D 11/06 205/324 |

(Continued)

FOREIGN PATENT DOCUMENTS

| | | |
|---|---|---|
| JP | H03240997 A | 10/1991 |
| KR | 101746620 B1 | 6/2017 |

OTHER PUBLICATIONS

12. Karambakhsh, Ali et al., "Pure Commercial Titanium Color Anodizing and Corrosion Resistance", Journal of Materials and Engineering and Performance, Springer US, Boston, vol. 20, No. 9, Feb. 5, 2011, pp. 1690-1696, XP019984903, ISSN: 1544-1024, Doi: 10.1007/S11665-011-9860-0., Feb. 5, 2011 (Year: 2011).*

(Continued)

*Primary Examiner* — Lee E Sanderson
*Assistant Examiner* — Michael C Romanowski
(74) *Attorney, Agent, or Firm* — Dorsey & Whitney LLP

(57) ABSTRACT

This application relates to a method for forming an enclosure for a portable electronic device. The enclosure includes a metal substrate having a first b* value. The method includes forming an anodized layer that overlays and is formed from the metal substrate, wherein the anodized layer has a second b* value that is no greater than 0.3 of the first b* value and no less than 0.3 less than the first *b value.

4 Claims, 11 Drawing Sheets

(56) References Cited

U.S. PATENT DOCUMENTS

| | | | | |
|---|---|---|---|---|
| 2005/0123745 | A1* | 6/2005 | Takahashi | C23C 8/80 |
| | | | | 428/332 |
| 2006/0019035 | A1* | 1/2006 | Munz | C23C 14/5853 |
| | | | | 427/402 |
| 2011/0147219 | A1* | 6/2011 | Lambourne | F02C 7/04 |
| | | | | 205/50 |
| 2013/0233717 | A1* | 9/2013 | Disegi | C25D 11/26 |
| | | | | 205/50 |
| 2014/0011020 | A1* | 1/2014 | Mertens | C23C 22/73 |
| | | | | 428/328 |
| 2014/0083861 | A1 | 3/2014 | Askin et al. | |
| 2014/0166490 | A1* | 6/2014 | Tatebe | C25D 11/22 |
| | | | | 205/50 |
| 2015/0083598 | A1* | 3/2015 | Dascoulidou-Gritner | |
| | | | | C25D 11/022 |
| | | | | 205/50 |
| 2015/0197048 | A1* | 7/2015 | Chiang | B32B 15/20 |
| | | | | 428/307.3 |

OTHER PUBLICATIONS

Karambakhsh, Ali et al., "Pure Commercial Titanium Color Anodizing and Corrosion Resistance", Journal of Materials Engineering and Performance, Springer US, Boston, vol. 20, No. 9, Feb. 5, 2011, pp. 1690-1696, XP019984903, ISSN: 1544-1024,, Doi: 10.1007/S11665-011-9860-0., Feb. 5, 2011, 1690-1696.

Vittoria, D. M. et al., "Robust Anodic Colouring of Titanium: Effect of Electrolyte and Colour Durability", Materials & Design, Section 3.4.4 Colour Restoration, vol. 90, XP029357618, ISSN: 0265-1275, Doi: 10.1016/J.Matdes.2015.11.063, Nov. 17, 2015, pp. 1085-1091.

* cited by examiner

TITANIUM SURFACES WITH IMPROVED COLOR CONSISTENCY AND RESISTANCE TO COLOR CHANGE

CROSS-REFERENCE TO RELATED APPLICATIONS

The present application claims the benefit of U.S. Provisional Application No. 62/853,596, entitled "TITANIUM SURFACES WITH IMPROVED COLOR CONSISTENCY AND RESISTANCE TO COLOR CHANGE," filed May 28, 2019, the content of which is incorporated herein by reference in its entirety for all purposes.

FIELD

The described embodiments relate generally to an anodized part having increased resistance to undergoing a color change. More particularly, the described embodiments relate to techniques for using a controlled anodization process to form an engineered anodization layer that overlays a titanium substrate.

BACKGROUND

Enclosures for portable electronic devices may be processed in a variety of different colors so as to increase consumer appeal. However, when these enclosures are subjected to environmental exposure, the exposure may alter the colors of these enclosures and leave these enclosures susceptible to significant staining. Moreover, certain metals, such as titanium and alloys thereof, are far more susceptible to staining when subjected to oxidation in harsh environments. Accordingly, this uncontrolled variation in the appearance of these enclosures is generally undesirable in the consumer electronics industry.

SUMMARY

This paper describes various embodiments that relate to an anodized part having increased resistance to undergoing a color change. More particularly, the described embodiments relate to techniques for using a controlled anodization process to form an engineered anodization layer that overlays a titanium substrate.

According to some embodiments, a method for forming an enclosure for a portable electronic device, the enclosure including a metal substrate having a first b* value, is described. The method includes forming an anodized layer that overlays and is formed from the metal substrate, where the anodized layer has a second b* value that is no greater than 0.3 of the first b* value and no less than 0.3 less than the first *b value.

According to some embodiments, a method for processing a metal substrate is described. The method includes forming an anodized layer that overlays the metal substrate using an electrolytic anodizing process. The method further includes in response to determining that a color of the anodized layer exceeds a predetermined b* value: modifying the color of the anodized layer by using an anodizing voltage associated with the electrolytic anodizing process such that a b* value of the modified color of the anodized layer is between 3 and 8.

According to some embodiments, the enclosure includes an anodized layer that overlays and is formed from a substrate that includes titanium, where the anodized layer has a b* value that is between 3 and 8.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
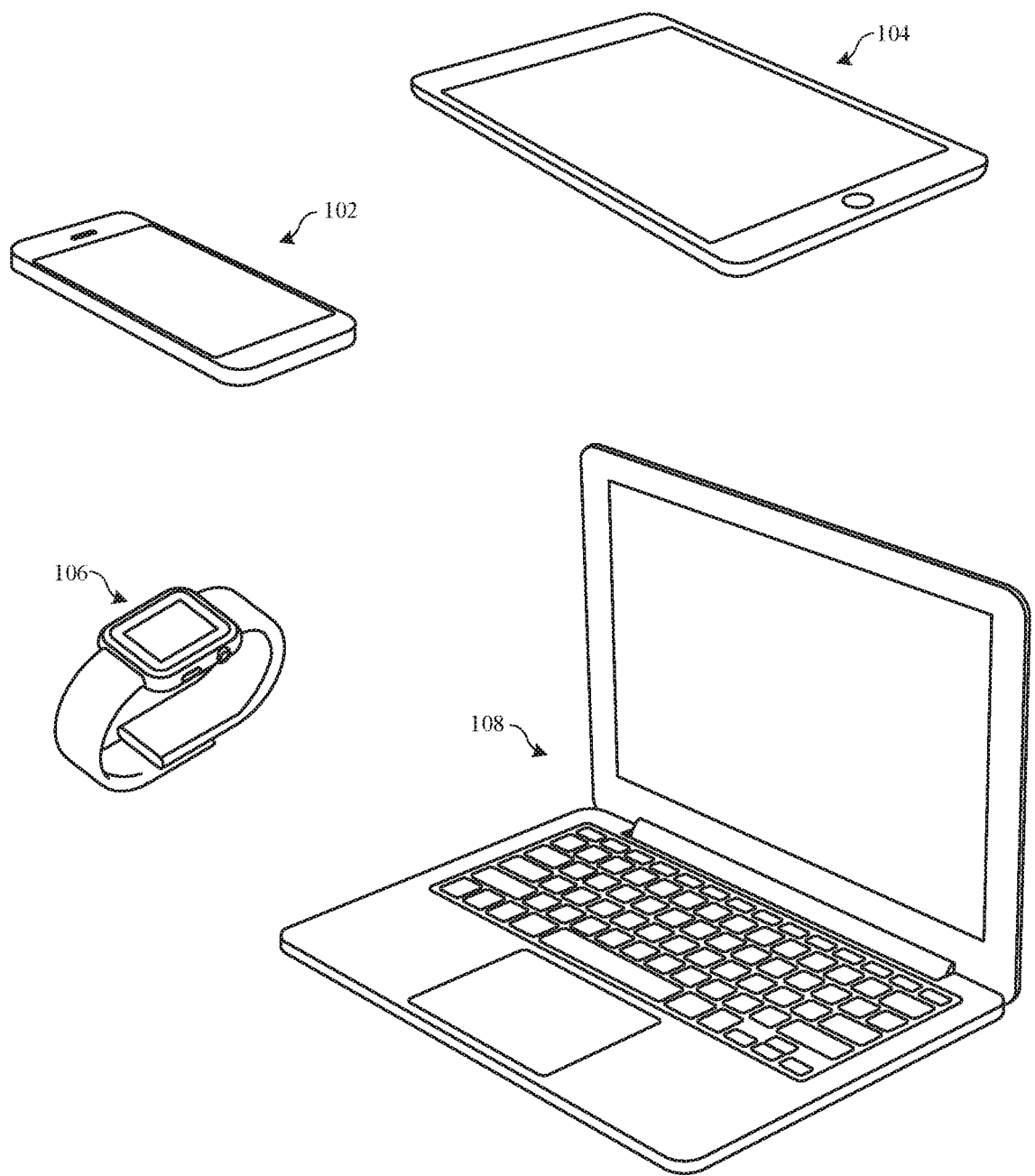
FIG. 1 illustrates perspective views of various portable electronic devices having enclosures that may be processed using the techniques described herein, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Enclosures for portable electronic devices may be processed in a variety of different colors so as to increase consumer appeal. However, when these enclosures are subjected to everyday environmental conditions, the exposure may alter the colors of these enclosures and leave these enclosures susceptible to significant staining and color change. For instance, these enclosures may be worn by a user and subjected to saltwater while the user is surfing, subjected to chlorinated water while the user is swimming, and sweat while the user is running. Thus, prolonged exposure to these environmental conditions throughout the life of the portable electronic device can cause an uncontrolled shift in appearance that is generally undesirable.

Moreover, certain metals, such as titanium and alloys thereof, are far more susceptible to staining and undergoing a color change when subjected to oxidation in harsh environments. Titanium is an attractive candidate over stainless steel for metal enclosures because of titanium's combination of low density and corrosion resistance. Moreover, titanium has the highest strength: weight ratio of any metal. By utilizing titanium in metal enclosures, thinner enclosures can be utilized to carry more components inside. However, in spite of these advantages, titanium is far more susceptible to environmental exposure. In particular, the color of a titanium surface may be progressively altered from a natural silver color towards a shade of yellow, then brown, and then even purple and blue when oxidized. Furthermore, titanium surfaces may be irreversibly stained when exposed to common chemicals and secretions, such as sebum. Consequently, these titanium surfaces may be stained permanent brown or purple.

One of the reasons for the high sensitivity of titanium to environmental exposure is that titanium has a native metal oxide layer that readily forms on its surface. Indeed, the native metal oxide layer forms instantly upon any exposure of the titanium to oxygen. Typically, the native metal oxide layer has a varied thickness and density that lends the native metal oxide layer very chemically reactive to oxygen. Furthermore, the native metal oxide layer is relatively permeable to oxygen, thereby causing continued oxidation at the oxide—metal interface that leads to thickening of the native metal oxide layer. The native metal oxide layer thickens with continued oxidation exposure, thereby causing the color of the native metal oxide layer to become noticeably more yellow. The discoloration of the native metal oxide layer can be attributed to thin film interference coloring, whereby interference between light reflected from the external surface of the native metal oxide layer and light reflected from the bottom surface of the native metal oxide layer results in destructive interference at the shortest end of the visible light spectrum, which removes some blue color and instead leaves a corresponding yellow color.

As described herein, the native metal oxide layer instantly grows upon a titanium surface when the titanium is oxidized. The rate of thickening slows with time, but does not stop due to factors that include temperature, humidity, environmental pH, thickness, composition and compactness of the native metal oxide layer, the composition of the titanium substrate, and the nature of any surface contaminants present on the native metal oxide layer. Since titanium readily interacts with water, hydrocarbons, and other compounds, it is extremely difficult to control and prevent color change of the titanium in a manufacturing or storage environment where these titanium parts can be stored for long periods of time. For example, a freshly machined titanium part that lacks a native metal oxide layer shows great variability in yellowness (~$b^*$ 1-2) in a matter of weeks. Furthermore, different parts and components of an enclosure for a portable electronic device may be subjected to different environmental exposures, storage conditions, and the like. For example, an enclosure for a smart watch having a button and a case that have an identical metallurgical titanium composition and an identical appearance immediately after machining may end up having different color appearances as a result of their different storage environments. Additionally, the history of formation of a natural metal oxide layer influences its structure and composition, and therefore, its chemical reactivity and sensitivity to further oxidation. Thus, the button and the case when exposed to an identical environment can also diverge in nature, thickness, and appearance over the lifetime of the smart watch. Consequently, the varied appearance between the button and the case significantly detracts from the appearance of the smart watch. Thus, in the consumer electronics industry, where significant attention is placed on ensuring that parts for enclosures for portable electronic devices are color-matched, it is desirable that the variation in color be less than 1 $b^*$, and even more desirable that the variation in color be less than <0.5 $b^*$.

Accordingly, the techniques described herein present means for precisely controlling the "natural" color of titanium by ensuring that the thickness and color of the engineered anodized layer is precisely controlled (e.g., ~1 nm-2 nm of thickness) while also eliminating any variability in density and stoichiometry of the engineered anodized layer. The native metal oxide layer is replaced with an engineered anodized layer having a similar thickness and appearance, but with a more carefully engineered and controlled appearance and composition. As a result, the engineered anodized layer is far less susceptible to color variation and further oxidation. Beneficially, this technique reduces part-to-part variability.

As used herein, the terms anodic film, anodized film, anodic layer, anodized layer, anodic oxide coating, anodic layer, anodic oxidized layer can be used interchangeably and refer to any appropriate anodized layers. Additionally, the terms oxide layer, metal oxide layer, and oxidized layer can be used interchangeably and refer to any appropriate metal oxide layers. In some examples, the term metal oxide layer can encompass an anodized layer. For example, the anodized layer may be formed as a result of an electrolytic anodization process. Additionally, the terms passivation layer, passivation film, passivation oxide layer, native oxide layer can be used interchangeably. In some examples, the term metal oxide layer can encompass the passivation layer. In particular, the passivation layer can be formed as a result of a non-electrolytic passivation process, such as by exposing a metal substrate to air or moisture to form a native metal oxide layer through a spontaneous oxidation process.

The metal oxide layers described herein may be formed on metal surfaces of a substrate. The substrate can include any of a number of suitable metals or metal alloys. In some embodiments, the substrate can include titanium or a titanium alloy. In some embodiments, the substrate includes metal and non-metal materials. The non-metal materials can include a polymer or thermoplastic. As used herein, the terms part, layer, segment, portion, and section can also be used interchangeably where appropriate.

In some examples, the color of the metal oxide layer and the anodized layer may be characterized according to CIE $L^*a^*b^*$ color-opponent dimension values. The $L^*$ color opponent dimension value is one variable in an $L^*a^*b^*$ color space. In general, $L^*$ corresponds to an amount of lightness. $L^*=0$ represents an extreme black while $L^*=100$ represents white. In general, $a^*$ indicates amounts of red color and green color in a sample. A negative a* value indicates a green color, while a positive a* value indicates a red color. Accordingly, samples having a positive a* value will indicate that more red than green is present. In general, b* indicates amounts of blue color and yellow color in a sample. A negative b* value indicates a blue color, while a positive b* value indicates yellow color. Accordingly, samples having a positive b* value will indicate more yellow than blue is present.

According to some embodiments, a method for forming an enclosure for a portable electronic device, the enclosure including a metal substrate having a first b* value, is described. The method includes forming an anodized layer that overlays and is formed from the metal substrate, where the anodized layer has a second b* value that is no greater than 0.3 of the first b* value and no less than 0.3 of the first *b value.

These and other embodiments are discussed below with reference to FIGS. 1-9; however, those skilled in the art will readily appreciate that the detailed description given herein with respect to these figures is for explanatory purposes only and should not be construed as limiting.

FIG. 1 illustrates various portable electronic devices that can be processed using the techniques as described herein. The techniques as described herein can be used to process metallic surfaces of enclosures of the portable electronic devices. In some examples, the color of the metallic surfaces of these enclosures may be tuned as a result of an electrolytic anodization process, to be described in more detail herein.

FIG. 1 illustrates exemplary portable electronic devices that may be processed using the techniques described herein, including a smartphone 102, a tablet computer 104, a smartwatch 106, and a portable computer 108. These exemplary portable electronic devices may be capable of using personally identifiable information that is associated with one or more users. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

Figure 2A:
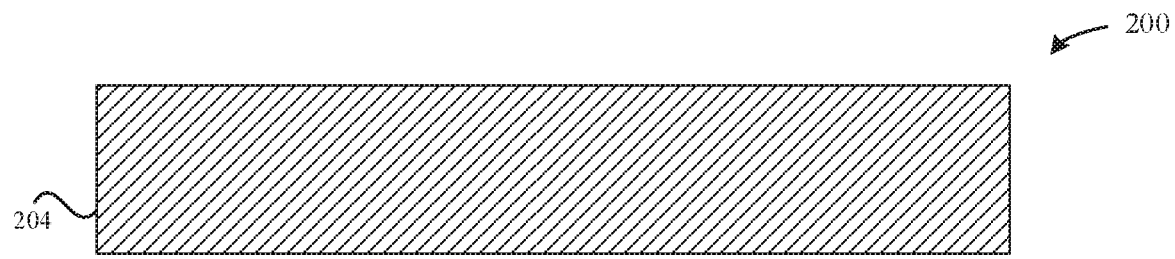
FIGS. 2A-2H illustrate cross-sectional views of a process for forming an engineered anodized part, in accordance with some embodiments.

FIGS. 2A-2H illustrate cross-sectional views of a metal part undergoing a process for forming an engineered anodized layer, in accordance with some embodiments. FIG. 2A illustrates a part 200 having a substrate 204. The part 200 may have any thickness suitable for any subsequent oxidation process, etching process, and/or electrolytic anodization process. In some embodiments, the part 200 has a near net shape of a final part, such as the enclosures of the portable devices 102, 104, 106, and 108. According to some examples, the metal substrate 204 is a three-dimensional structure having a height, width, and depth, and the metal substrate 204 can have any type of geometry that is suitable for forming a metal oxide layer and for attaching a non-metal layer to the metal part 200. In some examples, the geometry of the substrate 204 can include rectangular, polygonal, circular, beveled edges, angular edges, elliptical, etc. In some examples, the texture of the substrate 204 can be generally flat or a non-even surface.

Figure 2B:
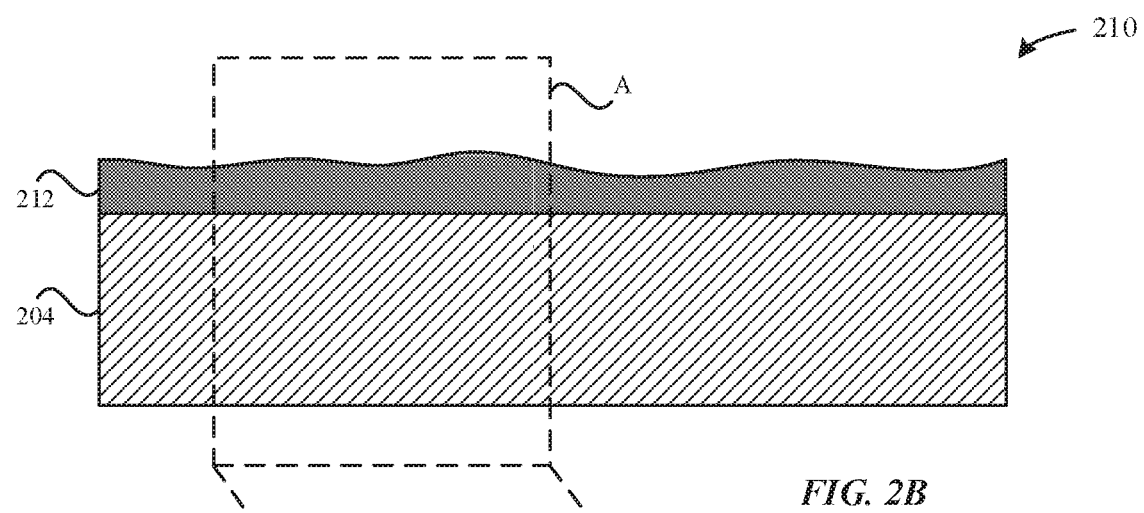

FIG. 2B illustrates an oxidized part 210 subsequent to a non-electrolytic passivation process, in accordance with some embodiments. In particular, the oxidized part 210 can include a metal oxide layer 212 that is disposed over the substrate 204 as a result of the non-electrolytic passivation process. In some examples, a surface of the substrate 204 may be cleaned prior to undergoing the passivation process. In some examples, during the non-electrolytic passivation process, the substrate 204 can be oxidized to form a native metal oxide layer through a spontaneous process by exposing the substrate 204 to air or moisture. For example, the substrate 204 can include titanium or a titanium alloy. In particular, titanium ions present in the substrate 204 may readily react with oxygen, which is present in water and/or air, thereby forming a titanium oxide. The metal oxide layer 212 that includes titanium oxide may also be referred to as a passivation layer. In some examples, the metal oxide layer 212 may grow in thickness and/or density from between about 3 nm to about 9 nm in thickness. However, as the metal oxide layer 212 grows in thickness, the external surface of the metal oxide layer 212 continues to change color and becomes noticeably more yellow in color. For instance, the color of the metal oxide layer 212 having a thickness between about 3 nm to about 9 nm, as measured, using a CIE L*a*b* color space, has a b* value between about 3 to about 8.

Figure 2C:
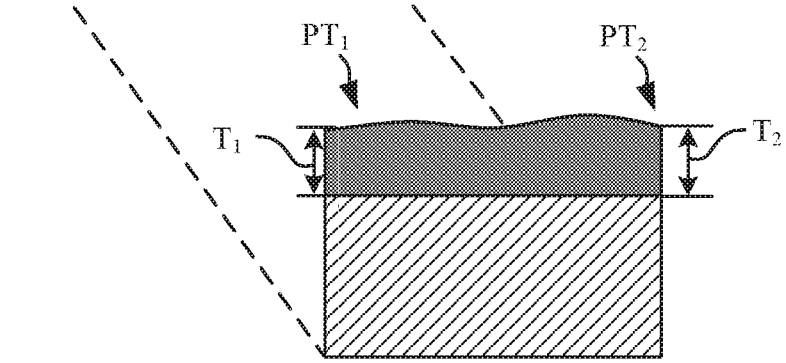

FIG. 2C illustrates a magnified view of the oxidized part 210 with reference to Section A of the oxidized part of FIG. 2B. In particular, the magnified view illustrates different regions ($PT_1$, $PT_2$) of the metal oxide layer 212. As described herein, the metal oxide layer 212 due to its imprecise passivation oxidation process, may have a variation in thickness. For example, region ($PT_1$) of the metal oxide layer 212 may be characterized as having a thickness ($T_1$), and a region ($PT_2$) of the metal oxide layer 212 that is adjacent to the region ($PT_1$) has a thickness ($T_2$) that is substantially different. For example, FIG. 2C illustrates that ($T_2$)>($T_1$). As the color of the metal oxide layer 212 may be correlated to the thickness of the metal oxide layer 212, these regions ($PT_1$, $PT_2$) may be characterized as having different colors.

Furthermore, FIG. 2C illustrates that the metal oxide layer 212 has a generally amorphous structure, a variable stoichiometry of metal oxide material, random flakes, different levels of porosity and permeability, and a non-uniform density of metal oxide material. Consequently, these characteristics impart the metal oxide layer 212 with an inconsistent color appearance and non-uniform amount of hardness throughout. For example, the variations in color between the different regions ($PT_1$, $PT_2$) may exceed 1 b*, and therefore the variations can be perceived by the human eye.

Figure 2D:
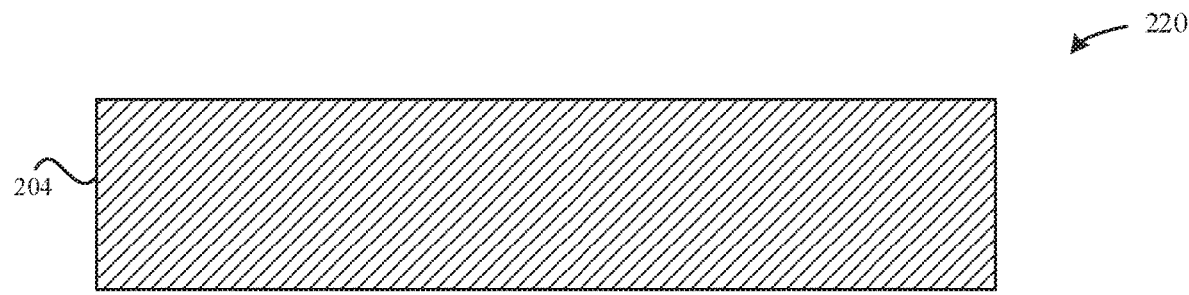

FIG. 2D illustrates a modified part 220 subsequent to a process for removing at least a portion of the metal oxide layer 212 from the oxidized part 210, in accordance with some embodiments. In particular, the metal oxide layer 212 may be removed by exposing the metal oxide layer 212 to a chemical etching process. In one example, the metal oxide layer 212 is subjected to hot acid etching using phosphoric acid, sulfuric acid, and/or oxalic acid or mixtures thereof. In some examples, the portion may refer to a majority of the metal oxide layer 212 that is removed from the oxidized part 210 such as to reveal a remaining portion (e.g., the substrate 204) of the oxidized part 210. In some examples, the portion may refer to substantially all of the metal oxide layer 212 that is to be removed from the oxidized part 210 such as to reveal a remaining portion of the oxidized part 210. In some examples, all of the metal oxide layer 212 may be removed from the oxidized part 210 such as to reveal a remaining portion of the oxidized part 210.

Removing at least a portion of the metal oxide layer 212 drives down the b* value of the modified part 220. Indeed, the more metal oxide material that is removed, the lower the b* value. In some examples, the b* value is driven down such that the modified part 220 assumes as close as possible to a natural titanium color. As described herein, the natural titanium color may be characterized as having a b* value of 3 or less. It should be noted that the natural titanium color of the modified part 220 is short-lived as a passivation oxide layer may quickly reform over the substrate 204. Accordingly, in order to prevent the passivation oxide layer from quickly reforming, the modified part 220 must be immediately subjected to a controlled anodization process such that the modified part 220 resists any significant color change.

Figure 2E:
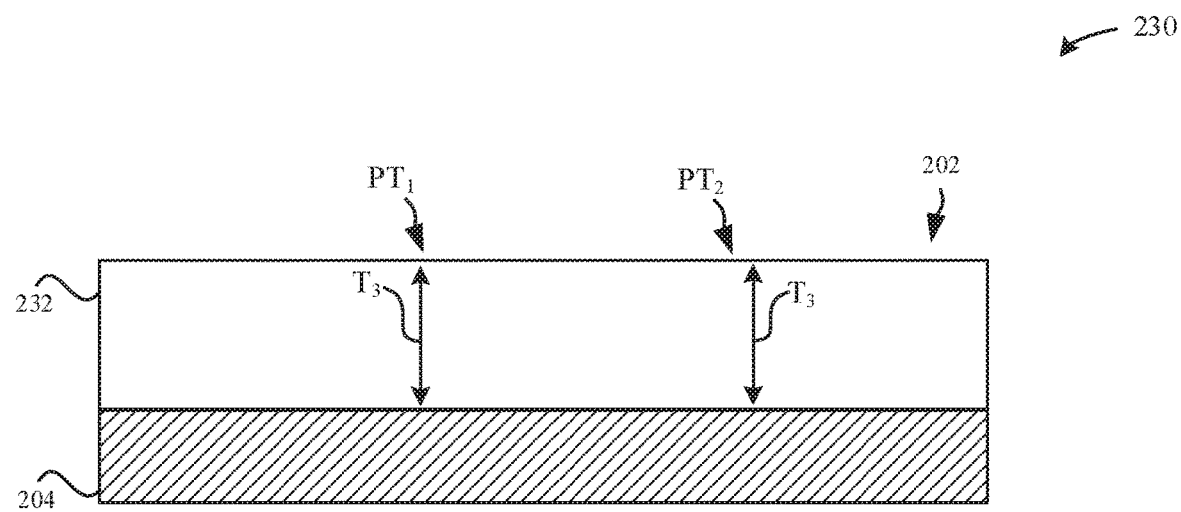

FIG. 2E illustrates an anodized part 230 subsequent to an electrolytic anodization process, in accordance with some embodiments. In particular, the modified part 220 is subjected to a controlled electrolytic anodization process such as to form an engineered anodized layer 232. In some embodiments, a portion or substantially all of the substrate 204 is converted or consumed by the conversion to the engineered anodized layer 232.

During the electrolytic anodization process, a thickness of the engineered anodized layer 232 may be precisely controlled by controlling the applied anodizing voltage associated with the electrolytic anodization process. In particular, the thickness of the engineered anodized layer 212 is a function of the applied anodizing voltage. For example, an additional 0.5 V of applied voltage results in a growth of about 1.5 nm of thickness and a corresponding increase in a b* value of ~1.7. Accordingly, in order to more precisely control the thickness and/or color of the engineered anodized layer 232, careful control must be implemented to not apply a high voltage during the electrolytic anodizing process. Indeed, the anodization techniques described herein may utilize specialized rectifiers capable of operating at a low voltage (e.g., ~1 V to ~2 V) to provide the precise amount of thickness and color control required. In contrast, conventional anodizing equipment may utilize rectifiers that operate at a high voltage (~100 V to 200 V), which are incapable of providing the precise amount of voltage control required for the techniques described herein.

In particular, FIG. 2E illustrates different regions ($PT_1$, $PT_2$) of the engineered anodized layer 232 that have locations that correspond to the different regions ($PT_1$, $PT_2$) of the metal oxide layer 212 of the oxidized part 210. In contrast to the metal oxide layer 212, the engineered anodized layer 232 has a more uniform thickness throughout. As a result, the regions ($PT_1$, $PT_2$) of the engineered anodized layer 232 may be characterized as having a generally equivalent thickness ($T_3$). As the color of the engineered anodized layer 232 may be correlated to the thickness of the engineered anodized layer 232, these regions ($PT_1$, $PT_2$) may be characterized as having a substantially uniform color. For example, these regions ($PT_1$, $PT_2$) may have a difference in b* value to within ±0.3. As is understood, variations in color having a b* of less than 1 cannot be generally perceived by the human eye.

According to some examples, the engineered anodized layer 232 can have a thickness between about 2 nanometers to about 6 nanometers. As the color of the engineered anodized layer 232 is a function of the thickness, the engineered anodized layer 232 can be tuned to have a b* value between about 5 to 8.

Furthermore, FIG. 2E illustrates that the engineered anodized layer 232 has a generally uniform density of metal oxide material. According to some examples, the engineered anodized layer 232 may have a thickness (e.g., $T_3$) that is less than or equal to a thickness of the metal oxide layer 212.

In particular, the thickness of the engineered anodized layer 232 may be deliberately less than the thickness of the metal oxide layer 212 such that an oleophobic layer and/or a hydrophobic layer may be applied to the external surface of the engineered anodized layer 232, as will be described herein. Beneficially, controlling the thickness of the engineered anodized layer 232 to be less than the thickness of the metal oxide layer 212, the color of the engineered anodized layer 232 can appear substantially similar to the color of natural titanium (i.e., b* value ~5 to ~8). Furthermore, the engineered anodized layer 232 has a reduced thickness compared to the metal oxide layer 212 such that the engineered anodized layer 232 can lay dormant in a storage environment without being subject to color variations.

Furthermore, the engineered anodized layer 232 substantially resists color change (e.g., appearing more yellow) when exposed to moisture, contaminants, and the like. In particular, the engineered anodized layer 232 has a more uniform composition, structure, and stoichiometry than the metal oxide layer 212. The generally uniform structure of the engineered anodized layer 232 contributes to the engineered anodized layer 232 being far more resistant to oxidation than the native metal oxide layer 212. Accordingly, the engineered anodized layer 232 provides a far more robust physical barrier against further discoloration and staining.

Figure 2F:
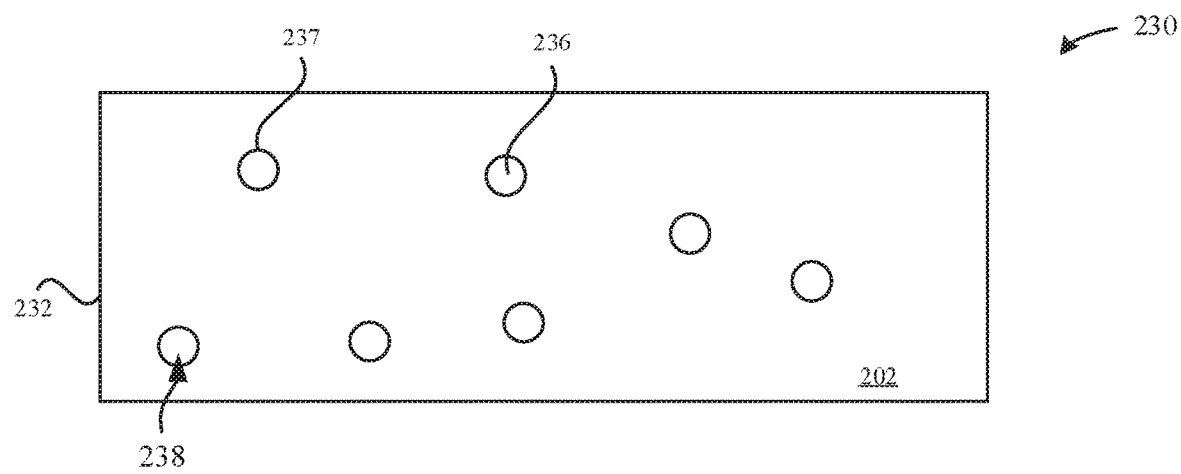

FIG. 2F illustrates a top view of the anodized part 230 of FIG. 2E. As a result of the electrolytic anodization process, the engineered anodized layer 232 is formed that overlays the substrate 204. The engineered anodized layer 232 can include pore structures 236 that are defined by pore walls 237 characterized as having generally columnar shapes that are elongated in a direction generally perpendicular to a central plane of an external surface 202 of the anodized part 230. Each of the pore structures 236 may include an opening 238 that extends into a terminus. The engineered anodized layer 232 is separated from the substrate 204 by a barrier layer.

Figure 2G:
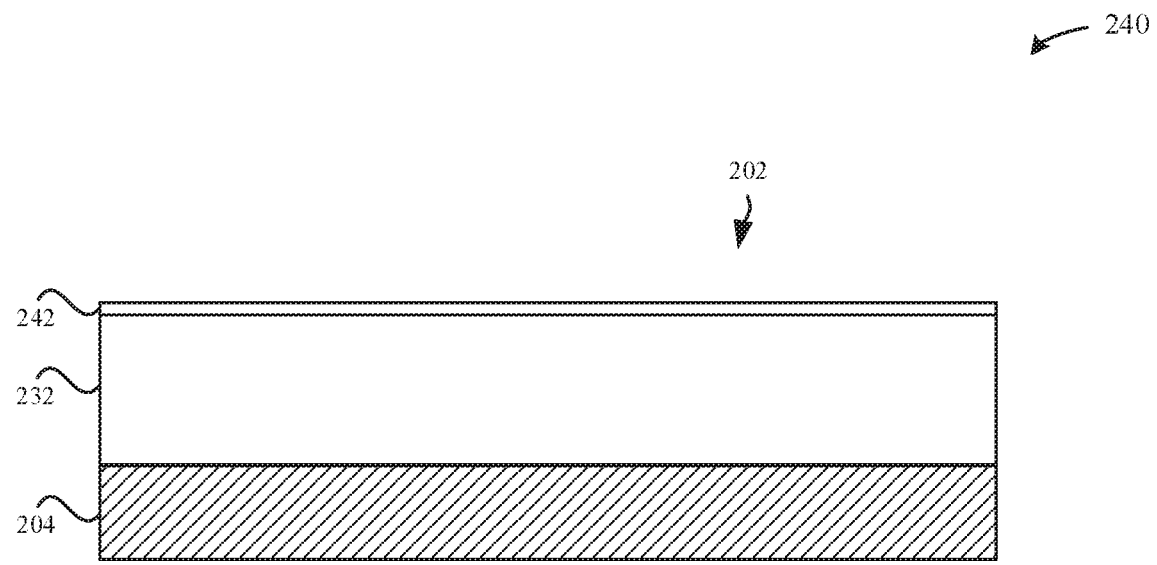

FIG. 2G illustrates a sealed part 240 subsequent to undergoing a hydrothermal sealing process, in accordance with some embodiments. According to some embodiments, the anodized part 230 is exposed to a sealing process. The sealing process involves hydrating the amorphous titania surfaces of the pore walls 237 such that amorphous titanium material swells and closes the opening 238 of the pore structures 236. In some examples, the hydrothermal sealing process may be performed in steam, hot water (e.g., at or near boiling temperature so as to reduce smutting), or at a temperature as low as about 70° C. Swelling of the titanium oxide of the engineered anodized layer 232 causes the openings 238 to narrow, thereby minimizing external elements from diffusing into the pore structures 236.

According to some embodiments, color particles (e.g., water-soluble dye pigments, etc.) may be infused into the pore structures 236 to impart the engineered anodized layer 232 with a color. As a result of the hydrothermal sealing process, the openings 238 are sealed with a seal 242. The seal 242 is comprised of hydrated material. The hydrothermal sealing process can lock in color particles within the pore structures 236 as well as protect the pore structures 236 from stains, dirt, external contaminants, and the like.

In some examples, sealing the engineered anodized layer 232 may modify the structure of the metal oxide material, such as increasing the density of the metal oxide material such as to raise the b* value of the engineered anodized layer 232 by about 10% to about 20% without substantially increasing the thickness of the engineered anodized layer 232 of the sealed part 240. Beneficially, the sealed part 240 is less susceptible to further thickening of the engineered anodized layer 232 when exposed to oxygen.

Figure 2H:
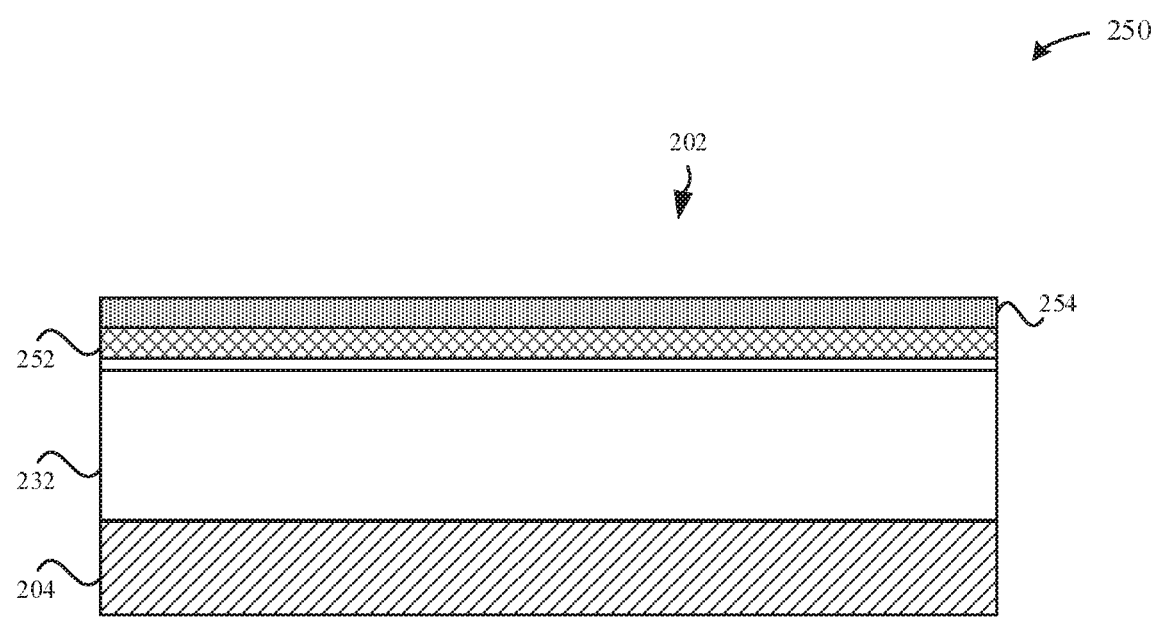

FIG. 2H illustrates a layered part 250 subsequent to the sealed part 240 undergoing a deposition process, in accordance with some embodiments. Prior to undergoing the deposition process, the sealed part 240 may be cleaned using plasma cleaning or ion beam cleaning. Thereafter, an adhesion layer 252 (e.g., $SiO_2$) may be deposited (e.g., physical vapor deposition, etc.) onto the engineered anodized layer 232. The adhesion layer 252 may be between about 3 nm to about 10 nm. The adhesion layer 252 may promote adhesion between the engineered anodized layer 232 and a fluoropolymer layer 254. The fluoropolymer layer 254 may be between about 3 nm to about 10 nm and provide a hydrophobic and/or oleophobic coating to prevent smudging of the surface of the external surface 202 of the engineered anodized layer 232. The fluoropolymer layer 254 may be deposited onto the adhesion layer 252. Beneficially, the combination of the adhesion layer 252 and the fluoropolymer layer 254 represents the greatest possible resistance to further oxidation and color staining of the engineered anodized layer 232.

Figure 3:
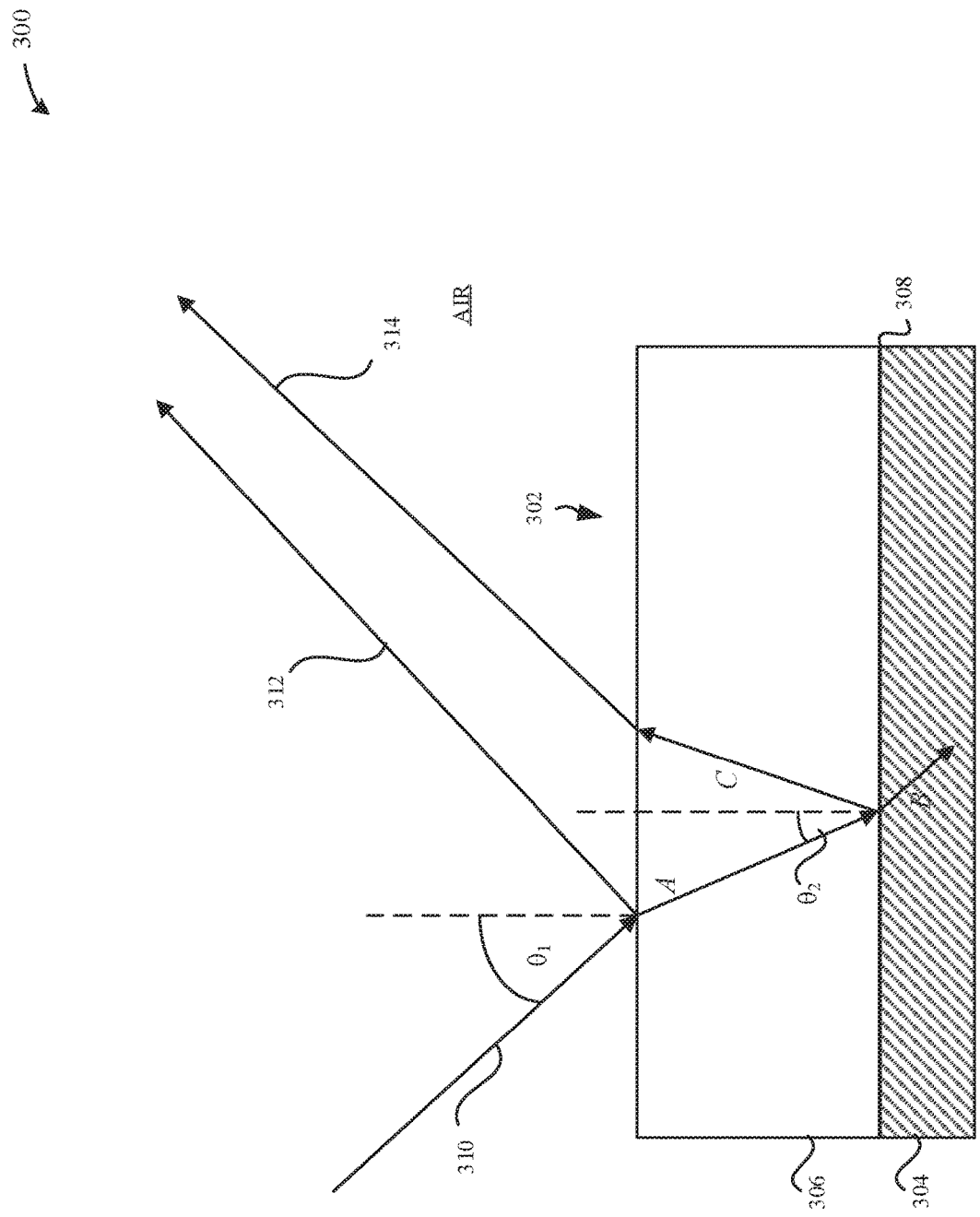
FIG. 3 illustrates a cross-sectional view of an engineered anodized part that imparts a light interference effect, in accordance with some embodiments.

FIG. 3 illustrates a cross-sectional view of a part that is capable of imparting a thin film interference effect, in accordance with some embodiments. The part 300 can refer to the anodized part 230, the sealed part 240, or the layered part 250. The part 300 can include an anodized layer 306 that overlays a substrate 304. The anodized layer 306 may act as a light reflecting medium that causes visible light rays 310 that are incident upon the external surface 302 of the anodized layer 306 to be reflected by the external surface 302 and a bottom surface 308 of the anodized layer 306. The external surface 302 can refer to a first reflective surface, and the bottom surface 308 can refer to a second reflective surface. When the visible light rays 310 are incident upon the external surface 302, an amount of the visible light rays 310 are reflected by the external surface 302 as reflected light ray 312, while a remaining amount of the visible light rays 310 pass through the anodized layer 306 before being reflected by the bottom surface 308 as reflected light ray 314.

The color imparted by the film interference effect may be based upon a refractive index of the anodized layer 306. In some examples, the refractive index is based upon a density and structure of the metal oxide material of the anodized layer 306. In some examples, the color of the anodized layer 306 is a function of the thickness of the anodized layer 306. If the anodized layer 306 appears yellow, then there may be a finding of destructive interference between the reflected light rays 312, 314. Moreover, the color of the anodized layer 306 will vary due to the thin film interference effect. For example, the color of the anodized layer 306 may provide a clue as to the amplitude of the anodizing voltage.

Figure 4:
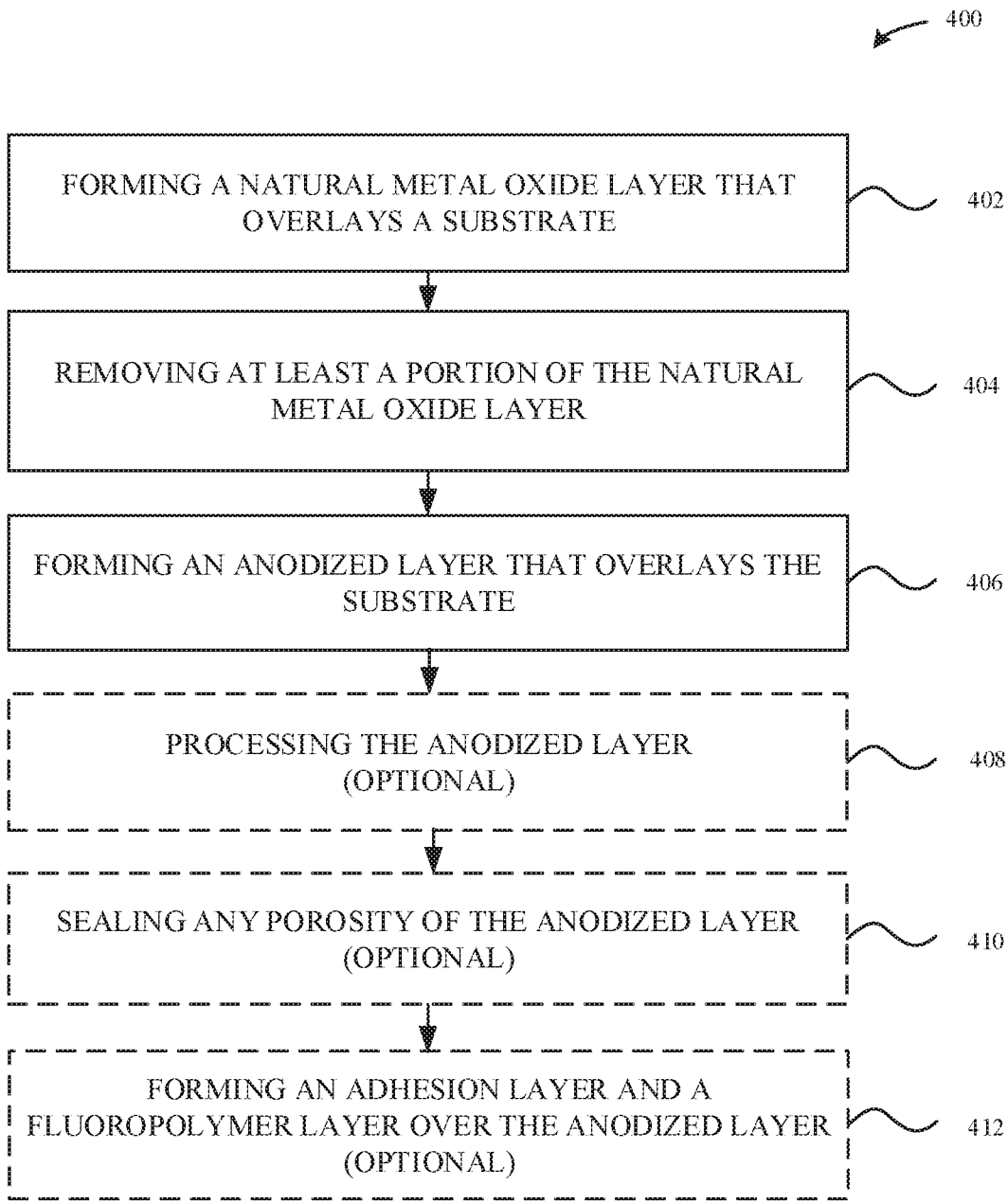
FIG. 4 illustrates a method for forming an engineered anodized part, in accordance with some embodiments.

FIG. 4 illustrates a method 400 for forming an anodized part, in accordance with some embodiments. As illustrated in FIG. 4, the method 400 begins at step 402, where a substrate—e.g., the substrate 204—is exposed to a passivation process such as to form the oxidized part 210 having the metal oxide layer 212. The passivation process is a non-electrolytic process that causes a native metal oxide layer to form via a spontaneous process by exposing the substrate 204 to oxygen.

At step 404, at least a portion of the metal oxide layer 212 may be removed from the oxidized part 210 such as to form the modified part 220. In some examples, the portion of the metal oxide layer 212 may refer to a minority of the metal oxide layer 212, a majority of the metal oxide layer 212, or generally all of the metal oxide layer 212. Removing the portion of the metal oxide layer 212 may expose a portion of the substrate 204. Since the portion of the substrate 204 may be exposed to oxygen, it may be preferable to immediately subject the modified part 220 to an electrolytic anodization process so as to prevent further color change.

At step 406, the modified part 220 is exposed to an electrolytic anodization process to form an anodized part 230. The anodized part 230 includes the engineered anodized layer 232 that overlays the substrate 204. The engineered anodized layer 232 may be referred to as an "engineered" anodized layer because the thickness of the engineered anodized layer 232 is controlled by tuning an anodizing voltage associated with the electrolytic anodization process. In particular, the thickness of the engineered anodized layer 212 is a function of the applied anodizing voltage. Accordingly, in order to more precisely control the thickness and/or color of the engineered anodized layer 232, careful control must be implemented to not apply a high voltage during the electrolytic anodizing process. Therefore, the anodization techniques described herein may utilize specialized rectifiers capable of operating at a low voltage (e.g., ~1 V to ~2 V) to provide the precise amount of thickness and color control required.

According to some examples, the color of the engineered anodized layer 232 may be tuned to correspond to any desired point within the color range (L*a*b values) of natural titanium. For example, natural titanium may have a b* value between about 3 to about 8. As described herein, natural titanium refers to titanium or an alloy thereof that lacks a metal oxide layer. More particular, the color of the engineered anodized layer 232 may be tuned to have a b* value that is within ±0.3 of a b* value of the modified part 220.

Thereafter, at step 408, the anodized part 230 is optionally subjected to a processing step. In some examples, the processing step can include cleaning the engineered anodized layer 232 with plasma cleaning or ion beam cleaning. In some examples, the processing step can include dyeing the engineered anodized layer 232.

At step 410, openings 238 of the pore structures 236 are optionally exposed to a sealing process such as to form the sealed part 240. The sealing process involves hydrating the amorphous titania surfaces of the pore walls 237 such that amorphous titanium material swells and closes the opening 238. Swelling of the titanium oxide of the engineered anodized layer 232 causes the openings 238 to narrow, thereby minimizing external elements from diffusing into the pore structures 236.

At step 412, the sealed part 240 is optionally exposed to a deposition process to form the layered part 250, in accordance with some embodiments. The deposition process includes depositing the adhesion layer 252 and the fluoropolymer layer 254 onto the engineered anodized layer 232. The adhesion layer 252 may promote adhesion between the engineered anodized layer 232 and a fluoropolymer layer 254. The fluoropolymer layer 254 may provide a hydrophobic and/or oleophobic coating to prevent smudging of the surface of the external surface 202 of the engineered anodized layer 232.

Figure 5:
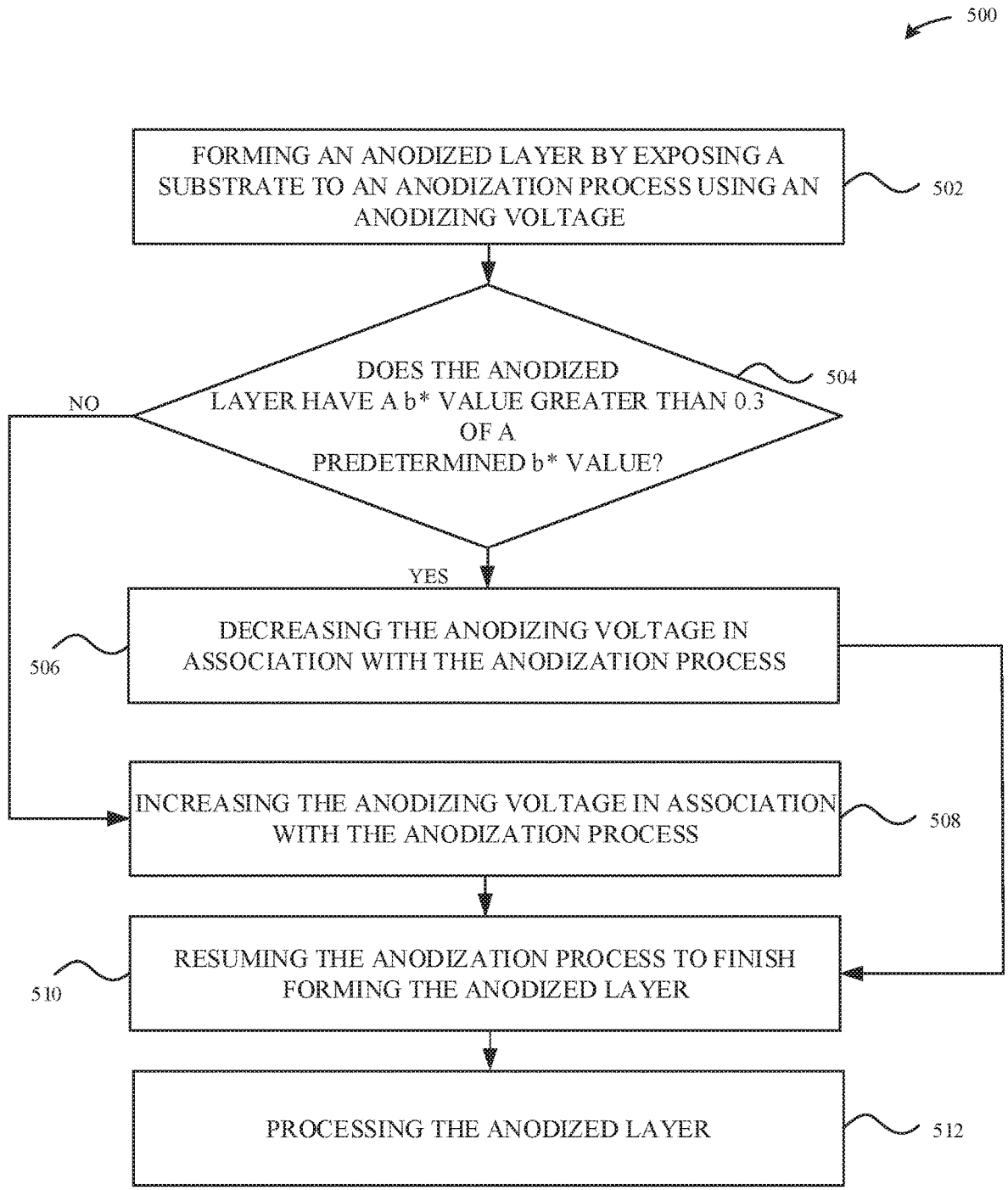
FIG. 5 illustrates a method for forming an engineered anodized part, in accordance with some embodiments.

FIG. 5 illustrates a method 500 for forming an anodized part, in accordance with some embodiments. In some embodiments, the method 500 can be implemented in conjunction with a closed feedback loop that is implemented by an optical detection system.

As illustrated in FIG. 5, the method begins at step 502, where a part—e.g., the modified part 220—is exposed to an anodization process using an anodizing voltage such as to form the anodized part 230. In some examples, the anodizing voltage is limited to operate at a low voltage (e.g., ~1 V to ~2 V) in order to more precisely control the thickness and color of the anodized part 230.

At step 504, an optical detection system may be utilized to monitor the color of the engineered anodized layer 232 and determine whether the engineered anodized layer 232 has a color that exceeds a predetermined color value and/or range. For example, the optical detection system may determine whether the b* value of the engineered anodized layer 232 is more than 0.3 greater than a b* value of the modified part 220. As described herein, one of the purposes of the electrolytic anodization process is to achieve a color that resembles that native titanium color as much as possible. Accordingly, if the b* value of the engineered anodized layer 232 is at least one of (i) more than 0.3 b* greater than the b* value of the modified part 220 or (ii) more than 0.3 b* less than the b* value of the modified part 220, then the optical detection system may provide a corresponding detection signal to a controller.

At step 506, if the optical detection system determines that the b* value of the engineered anodized layer 232 is >0.3 more than the b* value of the modified part 220, then the controller may decrease the anodizing voltage in association with the electrolytic anodization process. Accordingly, reducing the anodizing voltage may reduce the yellowness (and reduce the b* value) of the engineered anodized layer 232 by reducing the rate of growth of the engineered anodized layer 232.

Alternatively, at step 508, if the optical detection system determines that the b* value of the engineered anodized layer 232 is >0.3 less than the b* value of the modified part 220, then the controller may increase the anodizing voltage in association with the electrolytic anodization process. Accordingly, increasing the anodizing voltage may increase the yellowness (and increase the b* value) of the engineered anodized layer 232 by increasing the rate of growth of the engineered anodized layer 232.

In either instance, after adjusting the anodizing voltage, the method 500 proceeds to step 510, where the electrolytic anodization process concludes with forming the engineered anodized layer 232. The anodized part 240 having the engineered anodized layer 232 may have a color and/or thickness that corresponds to a predetermined value and/or range. In some embodiments, the anodized part 240 has a b* value that is ±0.3 of the b* value of the modified part 220. In some embodiments, the anodized part 240 has a b* value that resembles natural titanium (i.e., b* value between about 3 to about 9).

At step 512, the engineered anodized layer 232 may be processed. In some examples, the processing step can include cleaning the engineered anodized layer 232 with plasma cleaning or ion beam cleaning.

Figure 6:
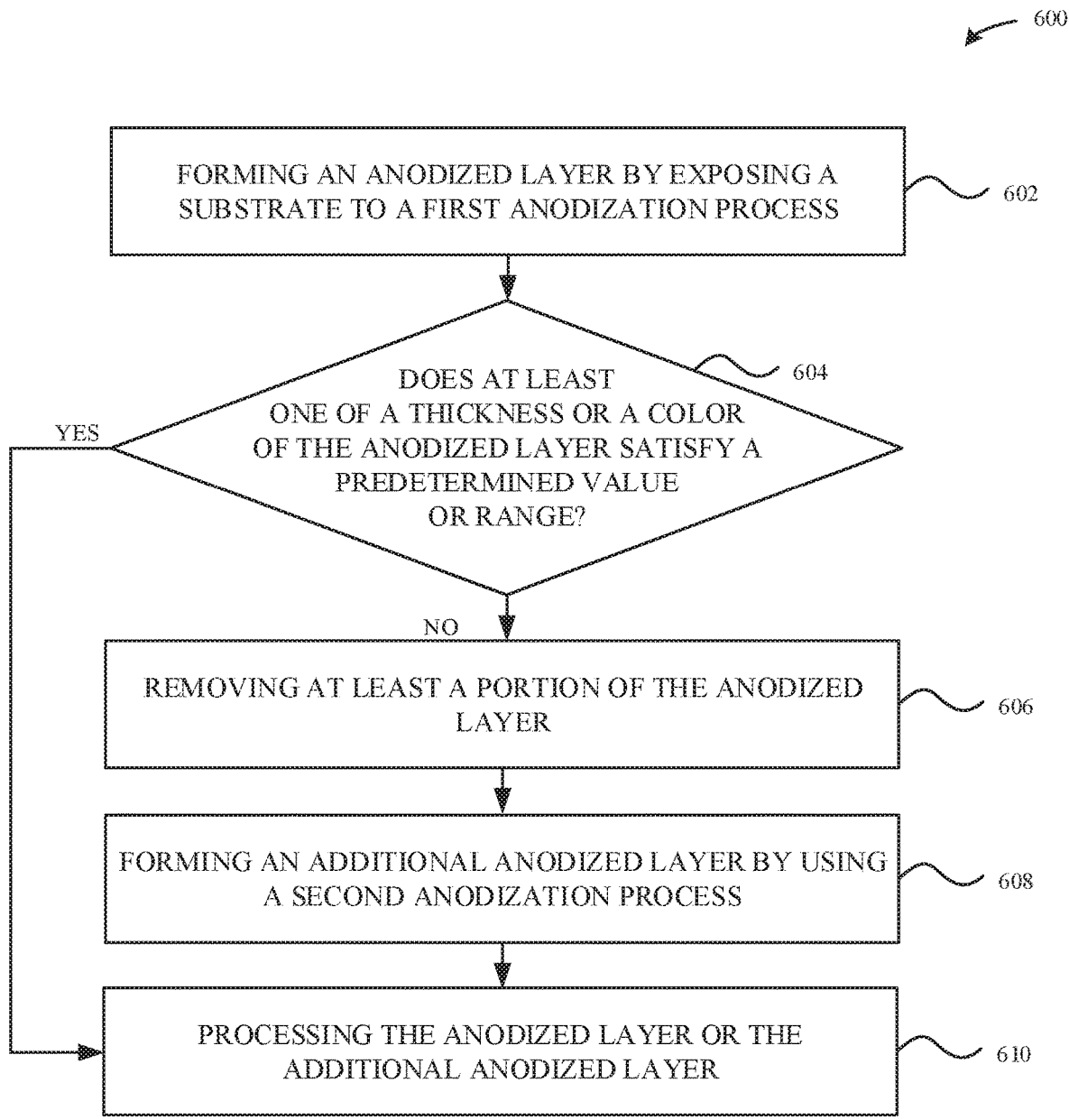
FIG. 6 illustrates a method for forming an engineered anodized part, in accordance with some embodiments.

FIG. 6 illustrates a method 600 for forming an anodized part, in accordance with some embodiments. In some embodiments, the method 600 can be implemented in conjunction with a closed feedback loop that is implemented by an optical detection system.

As illustrated in FIG. 6, the method begins at step 602, where a part—e.g., the modified part 220—is exposed to a first anodization process using an anodizing voltage such as to form the anodized part 230. In some examples, the anodizing voltage is limited to operating at a low voltage (e.g., ~1 V to ~2 V) in order to more precisely control the thickness and color of the anodized part 230. The anodized part 230 includes an engineered anodized layer 232.

At step 604, an optical detection system may be utilized to monitor the color and/or thickness of the engineered anodized layer 232 and determine whether at least one of the color or the thickness exceeds a predetermined value and/or range. For example, the optical detection system may determine whether the engineered anodized layer 232 has a b* value that is less than 2 or is greater than 9. As described herein, one of the purposes of the electrolytic anodization process is to achieve a color that resembles that native titanium color as much as possible. Accordingly, if the b* value of the engineered anodized layer 232 is less than 2 or is greater than 9, then the optical detection system may provide a corresponding detection signal to a controller.

At step 606, if the optical detection system determines that at least one of the thickness or color of the engineered anodized layer 232 does not satisfy the predetermine value and/or range, then the controller may provide a signal to stop the electrolytic anodizing process and cause a portion of the engineered anodized layer 232 to be removed. Indeed, reducing a thickness of the engineered anodized layer 232 by removing the portion of the engineered anodized layer 232 may adjust the color of the engineered anodized layer 232. Stripping the engineered anodized layer 232 with a hot acid etching can be utilized to reset the color and/or thickness of the engineered anodized layer 232. Beneficially, fine production tolerances can be achieved.

Thereafter, at step 608, an additional engineered anodized layer may be re-formed over the substrate 204 by subjecting the substrate 204 to a second anodization process. Similar to the first anodization process, the optical detection system may determine the thickness and/or color of the additional engineered anodized layer. If the thickness and/or color of the additional engineered anodized layer does not satisfy the predetermined threshold value and/or range, then the system may adjust the anodizing voltage (as described with reference to FIG. 5) and/or strip the additional engineered anodized layer and re-form yet another engineered anodized layer. It should be noted that a minor amount of the engineered anodized layer 232 can be removed to reset the thickness and/or color.

Alternatively, at step 610, if the optical detection system determines that at least one of the thickness or color of the engineered anodized layer 232 satisfies the predetermine value and/or range, then the controller may provide a signal to stop the electrolytic anodizing process such as to complete forming the engineered anodized layer 232. Thereafter, the engineered anodized layer 232 or the additional engineered anodized layer may be processed (e.g., cleaning, buffing, polishing, sealing, etc.).

Figure 7:
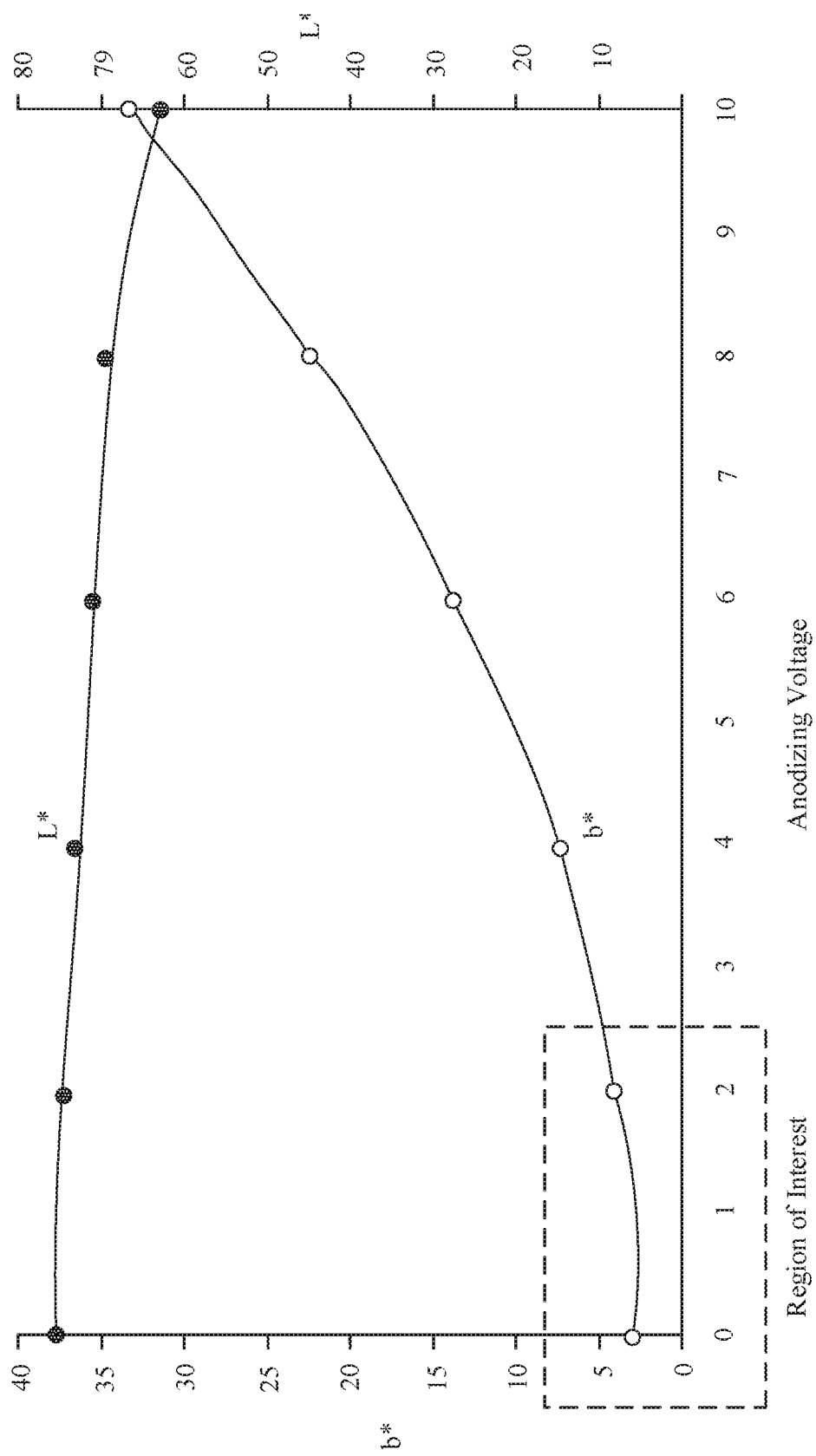
FIG. 7 illustrates an exemplary graph indicating a relationship between L* and b* values as a function of anodizing voltage, in accordance with some embodiments.

FIG. 7 illustrates an exemplary graph indicating a relationship between L* and b* values as a function of anodizing voltage, in accordance with some embodiments. As described herein, limiting the anodizing voltage during the electrolytic anodizing process is capable of providing more precise control over the color of the engineered anodized layer. FIG. 7 illustrates that the region of interest for the natural titanium color corresponds to a range of b* values between about 3 to about 9. Accordingly, the techniques described herein are directed towards imparting the engineered anodized layer with a color that resembles natural titanium. FIG. 7 illustrates that limiting the anodizing voltage to a range between about 0 V and about 3 V will facilitate in restricting the color of the resulting engineered anodized layer to the natural titanium color.

In contrast, conventional anodizing techniques generally utilize a higher range of anodizing voltages (i.e., between 20 V to 130 V) in order to impart bright interference colors to anodized layers. Consequently, and as illustrated in FIG. 7, utilizing the higher range of anodizing voltages causes the colors of these anodized layers to stray further from the natural titanium color.

Figure 8:
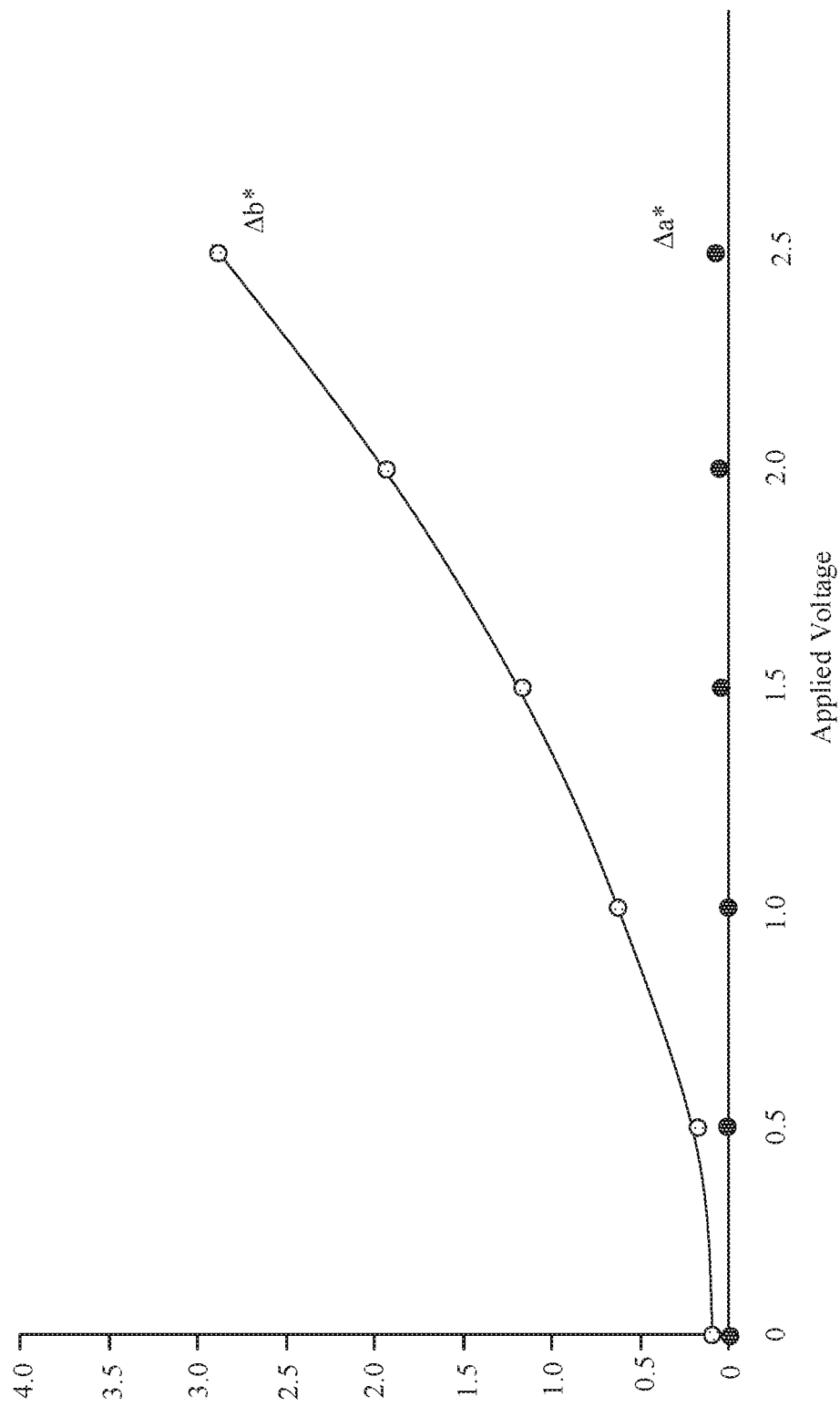
FIG. 8 illustrates an exemplary graph indicating a relationship between Δa* and Δb* values as a function of anodizing voltage, in accordance with some embodiments.

FIG. 8 illustrates an exemplary graph indicating a relationship between Δa* and Δb* values as a function of anodizing voltage, in accordance with some embodiments. As described herein, the techniques are directed towards imparting the engineered anodized layer with a color that resembles the natural titanium color as close as possible. In this manner, the native metal oxide layer is stripped from the oxidized part such as to form a modified part and to reduce the b* of the modified part as much as possible. Thereafter, during the electrolytic anodization process, it is determined whether the b* value of the color of the engineered anodized layer exceeds ±0.3 of the b* value of the modified part. FIG. 8 illustrates a positive function between the applied voltage and the b* value of the color of the engineered anodized layer. When the applied voltage is 0 V, then the Δb* value of the engineered anodized layer is about 0.2. When the applied voltage is 1 V, then the Δb* value of the engineered anodized layer is about 0.7. When the applied voltage is 2 V, then the Δb* value of the engineered anodized layer is about 2.0. FIG. 8 illustrates that the Δa* value does not undergo a significant change.

Figure 9:
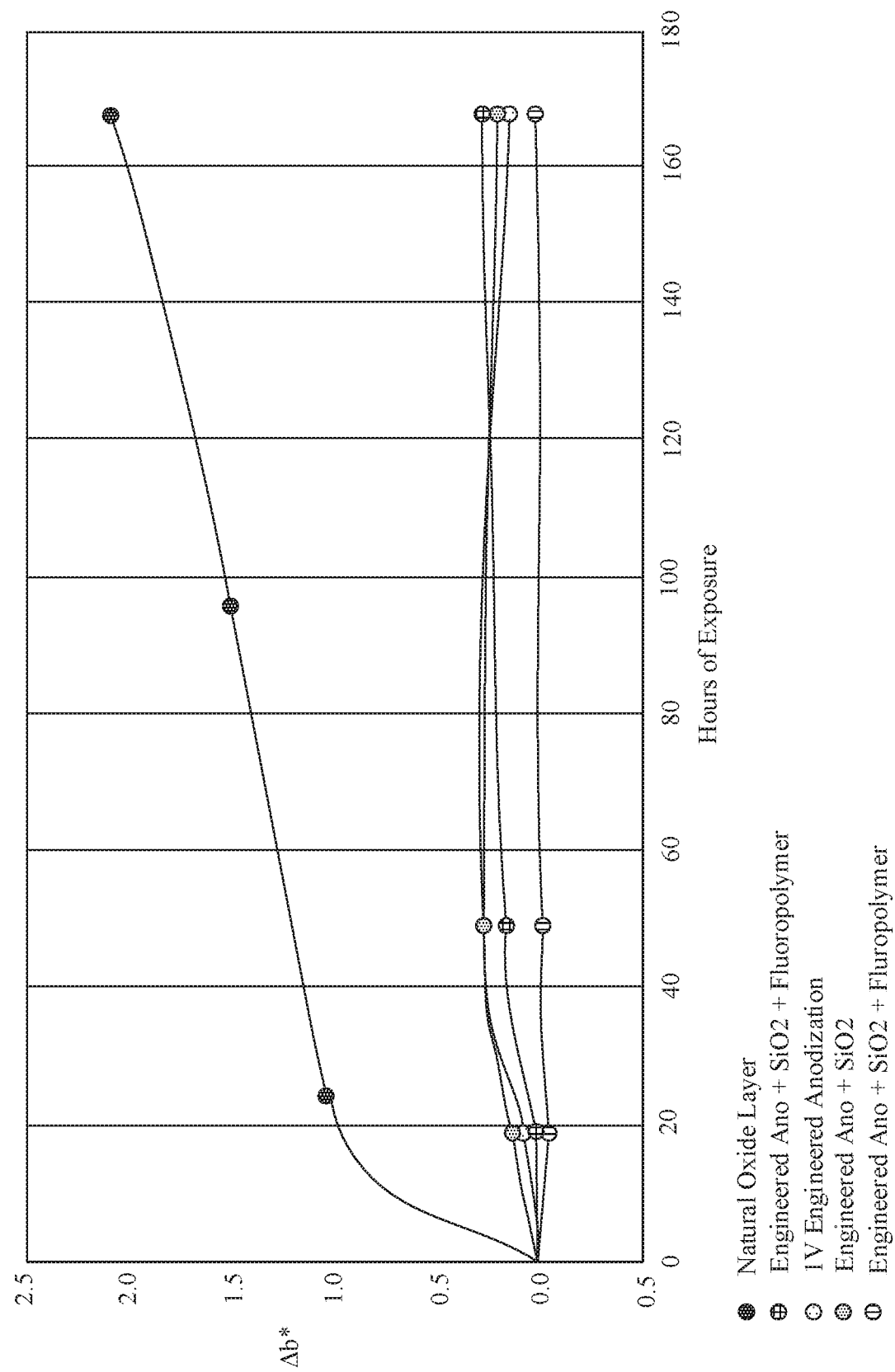
FIG. 9 illustrates an exemplary graph indicating a relationship between Δb* values as a function of hours of environmental exposure, in accordance with some embodiments.

FIG. 9 illustrates an exemplary graph indicating a relationship between Δb* values as a function of hours of environmental exposure, in accordance with some embodiments. FIG. 9 illustrates that the rate of further natural oxidation of the engineered anodized layer is greatly reduced as compared to that of a naturally occurring, uncontrolled native metal oxide layer. FIG. 9 illustrates various samples of parts that were subjected to environmental exposure. In particular, the samples include (i) a part having a native metal oxide layer, (ii) a part having an engineered anodized layer and $SiO_2$ and fluoropolymer layers, (iii) a part having an engineered anodized layer subjected to a 1 V anodizing voltage, (iv) a part having an engineered anodized layer and a $SiO_2$ layer, and (v) a part having an engineered anodized layer and $SiO_2$ and fluoropolymer layers. As demonstrated in FIG. 9, the part having the native metal oxide layer exhibited a Δb* of 2.3 after about 160 hours of environmental exposure. In contrast, the parts having the engineered anodized layer exhibited no greater than a Δb* of 0.3 after about 160 hours of environmental exposure.

In one instance, after one month of exposure, the native metal oxide layer may demonstrate about 1 b* increase. In contrast, the engineered anodized layer may demonstrate <0.2 b* increase.

In another instance, after accelerated exposure (e.g., 65° C., 95% relative humidity environmental exposure chamber that accelerates natural discoloration by a factor of ~5-7), the engineered anodized layer exhibited ~5× slower rate of yellowing as compared to the naturally occurring, uncontrolled native metal oxide layer. The resistance to yellowing and overall color change of the engineered anodized layer may be attributed to the precise control of the thickness, structure, and composition of the engineered anodized layer during the electrolytic anodization process that causes the engineered anodized layer to be more dense than the native metal oxide layer.

Moreover, the engineered anodized layer is resistant to staining by fingerprints and sebum from sweat, which can give permanent brown stains within just two weeks of everyday use on a native metal oxide layer. For example, in a typical accelerated material surface reliability test where 0.1 ml of sebum was applied in a spot, wiped off, and the sample was then exposed at 65° C., 90% RH for 72 hours, the native metal oxide layer exhibited a permanent, vivid brown/purple stain, whereas the engineered anodized layer exhibited no visible discoloration.

Any ranges cited herein are inclusive. The terms "substantially", "generally," and "about" used herein are used to describe and account for small fluctuations. For example, they can refer to less than or equal to ±5%, such as less than or equal to ±2%, such as less than or equal to ±1%, such as less than or equal to ±0.5%, such as less than or equal to ±0.1%.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An enclosure for a portable electronic device, the enclosure comprising:
   an anodized layer that overlays and is formed from a substrate comprising titanium, the anodized layer having a thickness between 2 nanometers and 6 nanometers, a b* value that is between 3 and 8, and an L* value that is above 60.

2. The enclosure of claim 1, wherein the anodized layer has a substantially uniform arrangement of pores.

3. The enclosure of claim 1, further comprising:
   an adhesion layer that overlays the anodized layer; and
   a fluoropolymer layer that is adhered to the anodized layer via the adhesion layer.

4. The enclosure of claim 1, wherein the substrate is a titanium alloy.

* * * * *